(12) United States Patent
Nagatani et al.

(10) Patent No.: US 8,145,965 B2
(45) Date of Patent: Mar. 27, 2012

(54) TEST APPARATUS FOR TESTING A DEVICE UNDER TEST AND DEVICE FOR RECEIVING A SIGNAL

(75) Inventors: Kenichi Nagatani, Tokyo (JP); Atsuo Sawara, Tokyo (JP); Hiroshi Nakagawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 695 days.

(21) Appl. No.: 12/125,936

(22) Filed: May 23, 2008

(65) Prior Publication Data

US 2008/0294952 A1 Nov. 27, 2008

Related U.S. Application Data

(60) Provisional application No. 60/939,859, filed on May 24, 2007.

(51) Int. Cl.
- G11C 29/00 (2006.01)
- G01R 31/28 (2006.01)
- G06F 11/00 (2006.01)

(52) U.S. Cl. ......... 714/736; 714/719; 714/732; 714/734
(58) Field of Classification Search .................. 714/718, 714/719, 724, 734, 736, 738; 365/200, 201
See application file for complete search history.

(56) References Cited

U.S. PATENT DOCUMENTS

| 6,593,801 | B1* | 7/2003 | Hattori | 327/544 |
| 6,819,602 | B2* | 11/2004 | Seo et al. | 365/193 |
| 6,990,423 | B2* | 1/2006 | Brown et al. | 702/117 |
| 7,245,154 | B1* | 7/2007 | Davidson et al. | 326/82 |
| 2005/0270038 | A1* | 12/2005 | Goishi | 324/606 |
| 2006/0036389 | A1* | 2/2006 | Ozora et al. | 702/108 |

FOREIGN PATENT DOCUMENTS

| JP | 2006003216 | 1/2006 |
| JP | 2006003331 | 1/2006 |
| JP | 2006010651 | 1/2006 |
| JP | 2006030090 | 2/2006 |

* cited by examiner

Primary Examiner — Jeffrey A Gaffin
Assistant Examiner — Daniel McMahon
(74) Attorney, Agent, or Firm — Jianq Chyun IP Office

(57) ABSTRACT

A test apparatus for testing a device under test includes a capture memory that stores thereon an output pattern received from the device under test, a header detecting section that reads the output pattern from the capture memory and detects a portion matching a predetermined header pattern in the output pattern, and a judging section that judges whether the output pattern is acceptable based on a result of comparison between a pattern, in the output pattern, which starts with the portion matching the predetermined header pattern and a corresponding expected value pattern.

20 Claims, 8 Drawing Sheets

TEST APPARATUS FOR TESTING A DEVICE UNDER TEST AND DEVICE FOR RECEIVING A SIGNAL

CROSS REFERENCE TO RELATED APPLICATION

This patent application claims priority from a provisional application No. 60/939,859 filed on May 24, 2007, the contents of which are incorporated herein by reference.

BACKGROUND

1. Technical Field

The present invention relates to a test apparatus. More particularly, the present invention relates to a test apparatus that judges whether a device under test is acceptable by comparing data output from the device under test with expected value data.

2. Related Art

In recent years, communication standards allowing high-speed data transmission, such as High-Definition Multimedia Interface (HDMI), are proposed. Semiconductor devices configured to control communication compatible with such high-speed communication standards transmit/receive data at a much higher bit rate than semiconductor devices of different types. Therefore, the semiconductor devices designed for such high-speed communication standards may not be tested appropriately by general-use test apparatuses designed for testing general semiconductor devices.

Here, semiconductor devices can be tested in such a manner that a test pattern is input into the semiconductor devices and that the semiconductor devices output patterns in response to the input test pattern. Note that semiconductor devices of a certain type may start outputting responding patterns at random timings. This type of semiconductor devices is configured to output a predetermined pattern at the start of the valid portions of the output patterns, where the predetermined pattern is referred to as a header pattern hereinafter. On condition that the test apparatus detects the header pattern, the test apparatus starts accepting the output patterns, as disclosed in Japanese Patent Application Publications Nos. 2006-10651, 2006-3216, 2006-3331 and 2006-30090.

For the tests of semiconductor devices which transmit data at a very high bit rate and which start outputting responding patterns at random timings, dedicated test apparatuses need to be developed. The development, however, may necessitate enormous costs. To deal with the cost issue, such semiconductor devices may be tested at a low cost by utilizing semiconductor devices of the same type which have been judged acceptable, in other words, golden devices. For example, devices under test are judged acceptable when determined to be capable of appropriately communicating with the golden devices.

However, the results of the tests performed by using the golden devices may be misrepresented by the capabilities of the golden devices. Specifically speaking, even when the timings at which the devices under test output signals are outside a predetermined timing margin, for example, the golden devices may be capable of appropriately accepting the output signals depending on their capabilities. If such happens, the devices under test are mistakenly judged acceptable, even though the devices under test are actually defective. As explained in the above, the tests utilizing the golden devices only determine whether the devices under test can communicate with the golden devices, and therefore can not accurately judge whether the devices under test comply with a certain standard in terms of the signal output timing and the signal voltage level.

SUMMARY

Therefore, it is an object of an aspect of the innovations herein to provide a test apparatus and a device which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus may include a test apparatus for testing a device under test. The test apparatus includes a capture memory that stores thereon an output pattern received from the device under test, a header detecting section that reads the output pattern from the capture memory and detects a portion matching a predetermined header pattern in the output pattern, and a judging section that judges whether the output pattern is acceptable based on a result of comparison between a pattern, in the output pattern, which starts with the portion matching the predetermined header pattern and a corresponding expected value pattern.

According to the second aspect related to the innovations herein, one exemplary device may include a device including therein a receiving section that receives a signal output from a different device. Here, the receiving section includes a differential comparator that outputs a reception signal determined by a difference between a positive signal input via a positive input thereof and a negative signal input via a negative input thereof, and a switching section (i) that, when the different device outputs a differential signal, inputs a positive signal and a negative signal of the differential signal into the positive input and the negative input of the differential comparator, and (ii) that, when the different device outputs a single-ended signal, inputs the single-ended signal into one of the positive and negative inputs of the differential comparator and inputs a threshold value used for determining a logic value of the single-ended signal into the other of the positive and negative inputs of the differential comparator.

According to the third aspect related to the innovations herein, one exemplary test apparatus may include a test apparatus for testing a device under test. The test apparatus includes a test signal supply section that supplies a test signal to the device under test, a receiving section that receives an output signal output from the device under test in response to the test signal, and a judging section that judges whether the output signal received by the receiving section is acceptable. Here, the receiving section includes a differential comparator that outputs a reception signal determined by a difference between a positive signal input via a positive input thereof and a negative signal input via a negative input thereof, and a switching section (i) that, when the device under test outputs a differential signal, inputs a positive signal and a negative signal of the differential signal into the positive input and the negative input of the differential comparator, and (ii) that, when the device under test outputs a single-ended signal, inputs the single-ended signal into one of the positive and negative inputs of the differential comparator and inputs a threshold value used for determining a logic value of the single-ended signal into the other of the positive and negative inputs of the differential comparator.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on an embodiment, which does not intend to limit the scope of the present invention, but exemplifies the invention. All of the features and the combinations thereof described in the embodiment are not necessarily essential to the invention.

Figure 1:
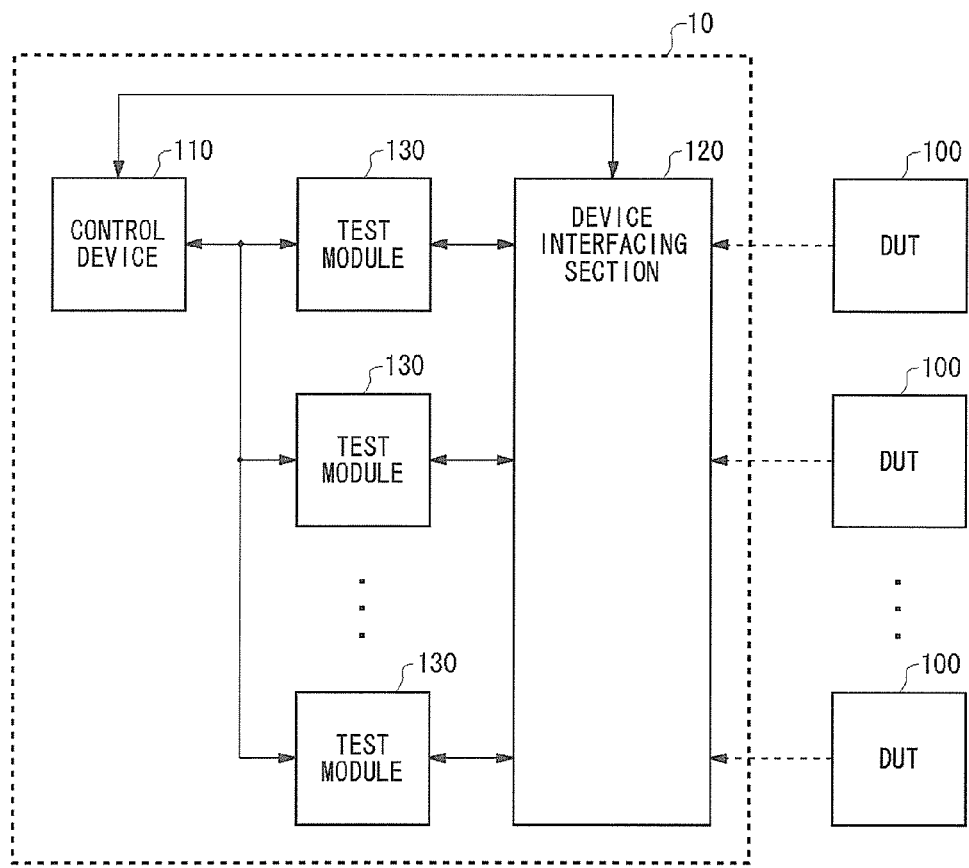
FIG. 1 illustrates the configuration of a test apparatus 10 relating to an embodiment of the present invention.

FIG. 1 illustrates the configuration of a test apparatus 10 relating to an embodiment of the present invention. The test apparatus 10 includes a control device 110, a device interfacing section 120 and test modules 130. The test apparatus 10 tests devices under test (presented as DUTs in FIG. 1) 100. The test apparatus 10 may test the devices under test 100 in parallel as shown in FIG. 1, or test a single device under test 100. The control device 110 gives instructions to the test modules 130 to control the tests of the devices under test 100. The device interfacing section 120 connects the devices under test 100 to the test modules 130 in a one-to-one correspondence.

Each test module 130 supplies a test signal to a corresponding one of the devices under test 100, and judges whether the corresponding device under test 100 is acceptable with reference to an output signal output from the corresponding device under test 100 in response to the supplied test signal. Each test module 130 has a delay element not only for supplying the test signal and accepting the output signal but also for testing the timing margin of the test signal. Each test module 130 controls the delay element so as to delay the test signal to be supplied to the corresponding device under test 100 or to adjust the timing of accepting the output signal from the corresponding device under test 100.

Figure 2:
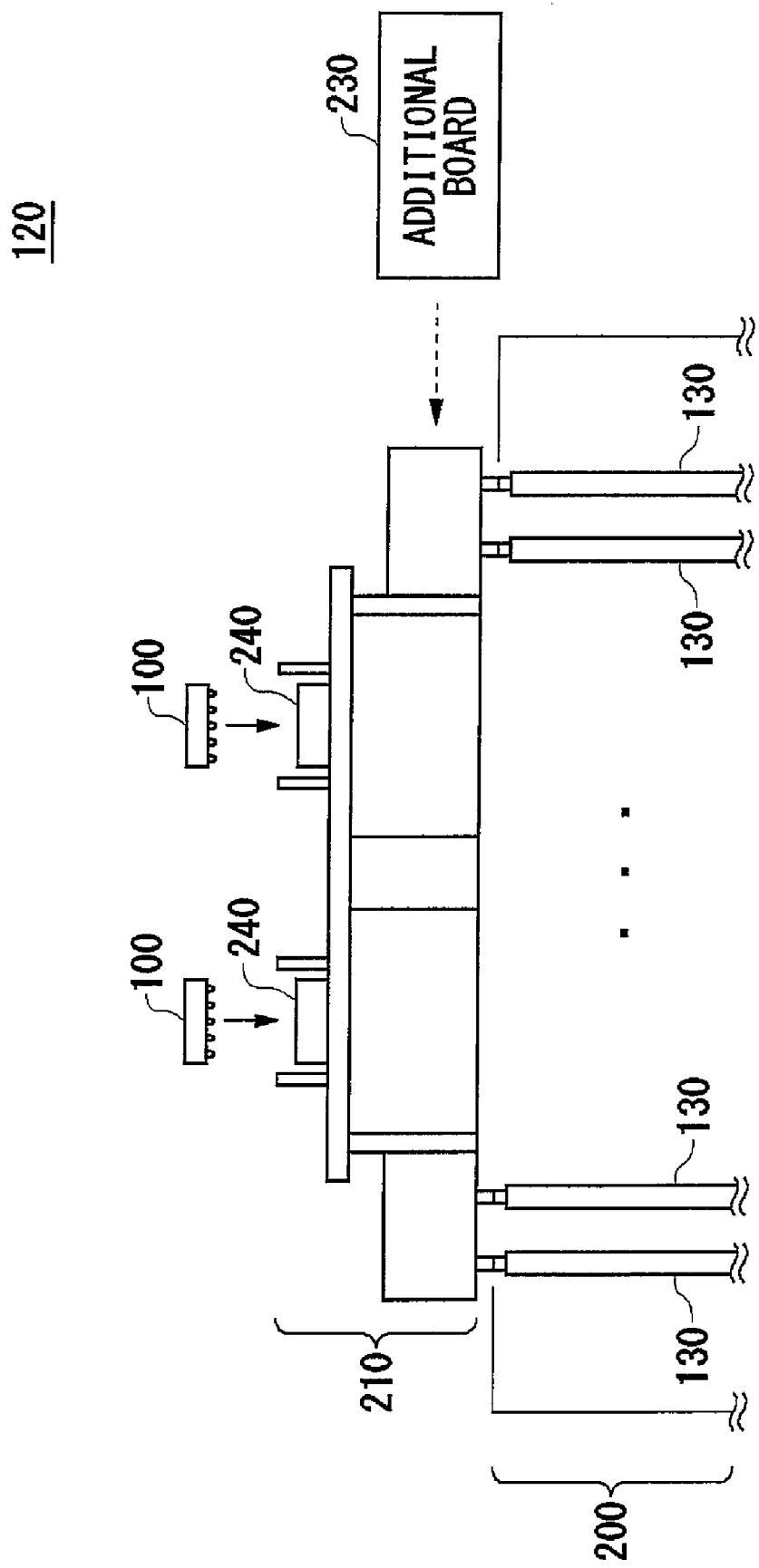
FIG. 2 is a schematic view illustrating the configuration of a device interfacing section 120 relating to the present embodiment.

FIG. 2 is a schematic view illustrating the configuration of the device interfacing section 120 relating to the present embodiment. The device interfacing section 120 includes a test head 200 and a performance board 210. The test head 200 has the test modules 130 built-in. The test head 200 includes terminals configured to transmit/receive signals to/from the devices under test 100, and connects the test modules 130 to the devices under test 100. The performance board 210 is placed on the test head 200, and connects the terminals on the test modules 130 to sockets 240.

The performance board 210 includes the sockets 240, to which the devices under test 100 are fitted in a one-to-one correspondence. With the above-described configuration, when the performance board 210 is mounted on the test head 200, the terminals of the devices under test 100 are connected to the test modules 130. An additional board 230 can be added to the performance board 210. When the additional board 230 is added to the performance board 210, the output patterns from the devices under test 100 are received not by the test modules 130 but by the additional board 230, and temporarily stored on a capture memory in the additional board 230. Subsequent processing transfers the output patterns temporarily stored on the additional board 230 to the test modules 130.

According to the test apparatus 10 of the present embodiment described above, the judgment as to whether the devices under test 100 are acceptable based on the output patterns are not performed concurrently with the output of the output patterns. Alternatively, the test apparatus 10 relating to the present embodiment first receives the output patterns at the additional board 230, and makes the acceptability judgment based on the output patterns after the output patterns are output. This configuration enables the test apparatus 10 to accurately judge whether the devices under test 100 are acceptable based on the data received at the additional board 230, even when the test head 200 and the test modules 130 are not compatible with the extremely high-speed data transmission of the devices under test 100. Therefore, the present embodiment can offer various advantages including the reduction in the developing and manufacturing cost for the test apparatus 10 and the compatibility between the high-speed the devices under test 100 and the conventional test apparatus 10.

The present embodiment will be further described in the following in more detail.

Figure 3:
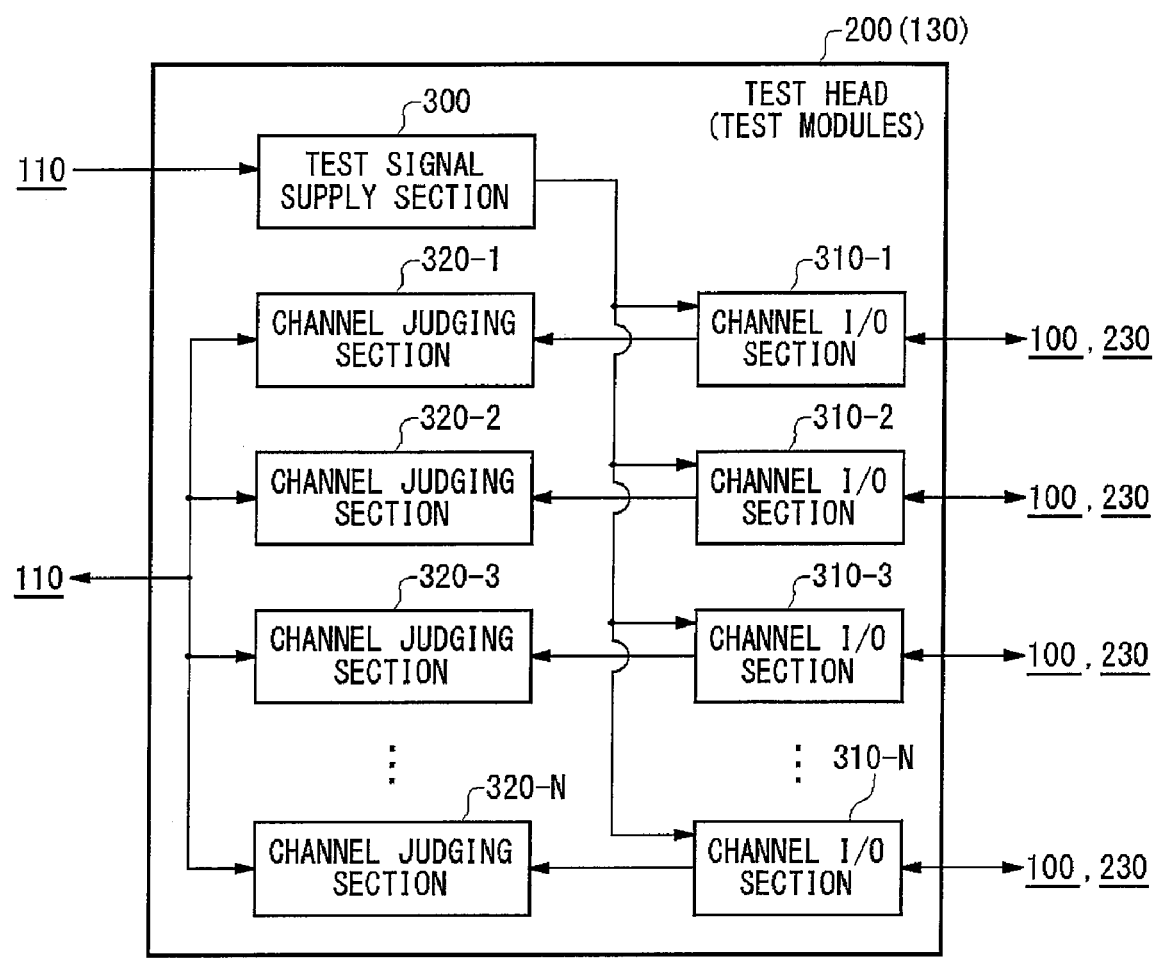
FIG. 3 illustrates the functional configuration of a test head 200 into which test modules 130 relating to the present embodiment are fitted.

FIG. 3 illustrates the functional configuration of the test head 200 into which the test modules 130 relating to the present embodiment are fitted. The test head 200 includes a test signal supply section 300, channel input/output (I/O) sections 310-1 to 310-N, and channel judging sections 320-1 to 320-N. The test signal supply section 300 supplies a test signal to the devices under test 100 in response to, for example, the instruction from the control device 110. The channel I/O sections 310-1 to 310-N are connected to the terminals of the devices under test 100, so as to transmit/receive signals to/from these terminals. For example, each of the channel I/O sections 310-1 to 310-N outputs a signal to a corresponding one of the terminals when receiving an instruction from the test signal supply section 300, where the signal constitutes a part of the test pattern.

Alternatively, the channel I/O sections 310-1 to 310-N may be connected to the additional board 230, so as to give instructions to the additional board 230 or to obtain the output data received by and stored on the additional board 230. Specifically speaking, the channel I/O section 310-1 is connected to the additional board 230 and/or a corresponding one of the devices under test 100. Here, the channel I/O section 310-1 is shown as an example of a first channel input/output section. Each of the channel I/O sections 310-1 to 310-N receives, from the additional board 230, a pattern which constitutes part of the output pattern from a corresponding one of the devices under test 100 and starts with a portion matching a header pattern. The channel I/O section 310-2 gives an instruction to the additional board 230 to read an output pattern from a capture memory 420 (mentioned later) provided in the additional board 230 and output the read pattern to the channel I/O section 310-1. Here, the channel I/O section 310-2 is shown as an example of a second channel input/output section.

The channel I/O section 310-3 is connected to the additional board 230, so as to be used as an interface that reads and writes registers in the additional board 230. Here, the channel I/O section 310-3 is shown as an example of a third channel input/output section. For example, the channel I/O section 310-3 may be used as an interface for a header storing register 440, a register provided for setting a delay amount and a frequency dividing/multiplying ratio at an adjusting circuit 415 and a register prepared for designating a selection made by a selector 405. Furthermore, one or more of the remaining channel I/O sections may output, to the additional board 230, a clock signal that is referred to by the additional board 230 to read an output pattern from the capture memory 420.

The channel judging sections 320-1 to 320-N are provided in a one-to-one correspondence with the channel I/O sections 310-1 to 310-N. Each of the channel judging sections 320-1 to 320-N receives an output signal from a corresponding one of the terminals of the devices under test 100 via a corresponding one of the channel I/O sections 310-1 to 310-N, and compares the output signal with an expected value signal. The expected value signal may be supplied to each of the channel judging sections 320-1 to 320-N from the control device 110. Based on the result of the comparison, each of the channel judging sections 320-1 to 320-N judges whether the output signal is acceptable or not. The result of the acceptability judgment may be output outside via the control device 110 or the like. For example, the channel judging section 320-1 compares the pattern received by the channel input/output section 310-1 with a corresponding expected value pattern, and judges whether the output pattern is acceptable based on the result of the comparison. Here, the channel judging section 320-1 is a first channel judging section corresponding to the first channel input/output section.

Figure 4:
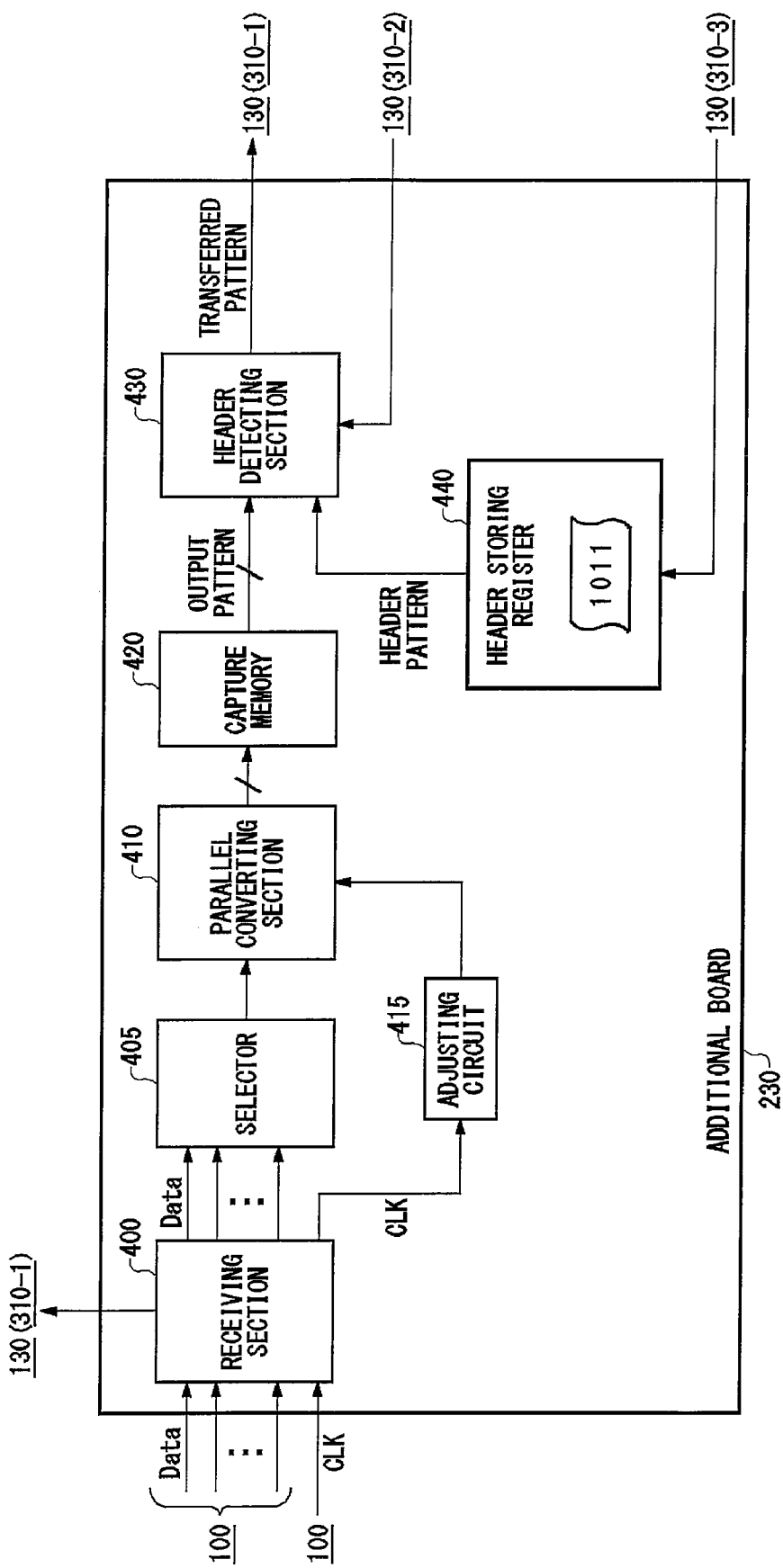
FIG. 4 illustrates the functional configuration of an additional board 230 relating to the present embodiment.

FIG. 4 illustrates the functional configuration of the additional board 230 relating to the present embodiment. The additional board 230 is shown as an example of a device relating to the present invention. The additional board 230 receives output signals from the devices under test 100. Each of the devices under test 100 is shown as an example of a different device relating to the present invention. The additional board 230 includes a receiving section 400, a selector 405, a parallel converting section 410, an adjusting circuit 415, a capture memory 420, a header detecting section 430, and a header storing register 440. The receiving section 400 receives the output patterns output from the devices under test 100 in response to the test signal, in accordance with the reference clock. The receiving section 400 outputs the received output patterns to the selector 405. The receiving section 400 may selectively output the received output patterns to the selector 405 or the test modules 130. With such a configuration, the test apparatus 10 can efficiently utilize the test modules 130, instead of the capture memory 420, for tests such as so-called DC tests which can be performed without taking a high bit rate into consideration.

The selector 405 is provided since the capture memory 420 may not have a sufficient storage capacity for storing all of the output patterns. The selector 405 selects a predetermined output pattern from the output patterns, and supplies the selected output pattern to the parallel converting section 410.

The parallel converting section 410 converts the received output pattern, which is output from the corresponding device under test 100 in a serial manner, into an output pattern of a parallel format, which is hereinafter referred to as a parallel output pattern. The adjusting circuit 415 adjusts the frequency and phase of the reference clock received by the receiving section 400, and inputs the adjusted reference clock into the parallel converting section 410. For example, the adjusting circuit 415 is realized by serial-connecting a delay element and a phase lock loop (PLL). In detail, the delay element changes the phase of the reference clock, and the PLL changes the frequency of the reference clock into a predetermined value. By varying the delay amount of the delay element and the setting of the PLL, the test apparatus 10 can set, at a desired value, the phase difference between the output signal indicating the output pattern and the reference clock, thereby performing various types of tests.

The capture memory 420 stores the parallel output pattern obtained by the parallel converting section 410 by converting the output pattern received from the corresponding device under test 100, on successive addresses. The header storing register 440 stores a predetermined header pattern. The header pattern is a bit sequence indicating the start of a valid portion of an output pattern, and is determined in advance by the specifications of the devices under test 100. The header pattern varies depending on the specifications, but is preferably data that has two or more bits and requires two or more clock cycles to be output. The header pattern may be set freely, for example, before the test apparatus 10 starts a test. Specifically speaking, the header storing register 440 may set the values of the header pattern at predetermined values in response to an instruction from, for example, the channel judging section 320-2 realized by the test modules 130.

The header detecting section 430 starts operating in response to an instruction from, for example, the channel I/O section 310-2 realized by the test modules 130, and sequentially reads the parallel output pattern from the successive addresses of the capture memory 420. The header detecting section 430 detects a portion matching the header pattern in the read output pattern. The header detecting section 430 outputs a pattern which constitutes part of the output pattern and starts with the portion matching the header pattern, to the channel I/O section 310-1 realized by the test modules 130. On reception of the pattern, the channel judging section 320-1 compares the received pattern with a corresponding expected value pattern, and judges whether the output pattern is acceptable based on the result of the comparison.

Figure 5:
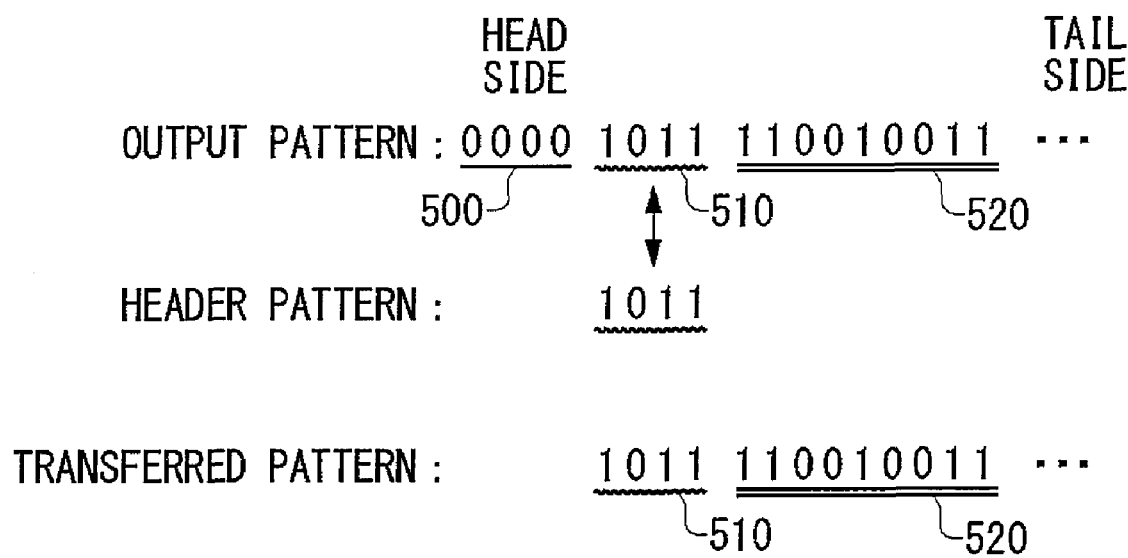
FIG. 5 illustrates an example of an output pattern relating to the present embodiment, in comparison with a header pattern.

FIG. 5 illustrates an example of the output pattern relating to the present embodiment, in comparison with the header pattern. Before the devices under test 100 start outputting data, the respective terminals of the devices under test 100 do not output predetermined signal levels corresponding to the specifications, but output random signal levels. This is caused by the arrangement of the termination resistances in the circuits constituting the devices under test 100 or the signal noise received by the devices under test 100 from outside. Furthermore, some types of the devices under test 100 may start outputting the responding patterns at timings determined independently from the rising or falling edges of the clock signal. For the reasons stated above, the test apparatus 10 may mistakenly accept, as the data, the signals having such random levels before the devices under test 100 start outputting the data. Such erroneous data is illustrated in FIG. 5 as a random pattern 500.

Each device under test 100 outputs, at the start of the valid portion of the output data, a predetermined header pattern that represents the start of the valid portion of the output data. The header pattern is shown as a header pattern 510 in FIG. 5. For example, the header pattern 510 is a four-bit sequence "1011". The header detecting section 430 sequentially scans the output pattern from its start, and compares the output pattern with the header pattern prestored on the header storing register 440. Specifically speaking, the header detecting section 430 may sequentially read the parallel output pattern from the capture memory 420 while shifting the reading position by one bit at each time, and compares the read output pattern against the header pattern. Alternatively, the header detecting section 430 may sequentially store, onto a predetermined register, each portion of the output pattern read from the capture memory 420, and compare the values of the register with the header pattern.

When a portion of the output pattern matches the header pattern, the header detecting section 430 transfers, to the test modules 130, data indicating a pattern which constitutes part of the output pattern and starts with the portion matching the header pattern. The transferred pattern is shown as a to-be-tested pattern 520 in FIG. 5. By comparing the to-be-tested pattern 520 with an expected value pattern, the test apparatus 10 tests each device under test 100. When detecting that the portion of the output pattern matches the header pattern, the header detecting section 430 may add additional information to the pattern which starts with the portion matching the header pattern, and output the pattern including the additional information to the test head 200. Here, the additional information indicates the position of the header pattern in the output pattern, for example.

Figure 6:
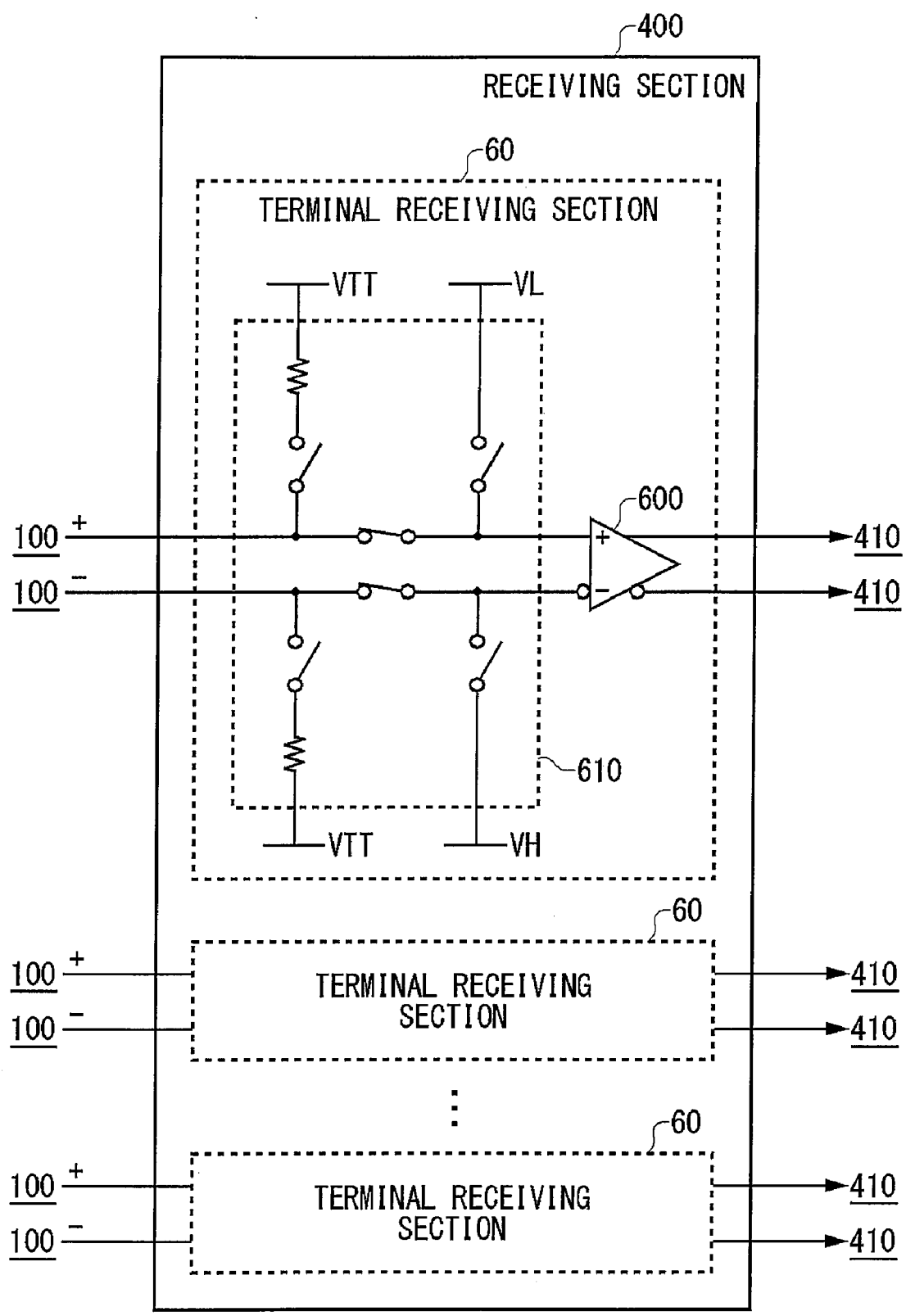
FIG. 6 schematically illustrates the configuration of a receiving section 400 relating to the present embodiment.

FIG. 6 schematically illustrates the configuration of the receiving section 400 relating to the present embodiment. The receiving section 400 includes terminal receiving sections 60. The terminal receiving sections 60 are provided in correspondence with pairs of terminals of the devices under test 100, which respectively output differential signals. Each terminal receiving section 60 includes a differential comparator 600 and a single-ended switching section 610. The differential comparator 600 receives from the corresponding device under test 100 the output pattern which is a differential signal, and outputs the output pattern to the parallel converting section 410. The single-ended switching section 610 is disposed on the signal line connecting the pair of output terminals of the corresponding device under test 100 to the differential comparator 600, and transfers the signal output from the corresponding device under test 100 to the differential comparator 600.

In more detail, when the corresponding device under test 100 outputs a differential signal, the single-ended switching section 610 inputs the positive and negative signals forming the differential signal respectively into the positive and negative inputs of the differential comparator 600. The differential comparator 600 outputs, to the parallel converting section 410, a reception signal created in accordance with the difference between the positive and negative signals received at its positive and negative inputs. For example, when the positive signal has a higher voltage level than the negative signal, the differential comparator 600 outputs a reception signal whose logical value indicates a true. When the positive signal has a lower voltage level than the negative signal, the differential comparator 600 outputs a reception signal whose logical value indicates a false.

The single-ended switching section 610 may use the differential comparator 600 to independently test the positive or negative signal of the differential signal, or to test a single-ended terminal. The following describes examples of such tests with reference to FIGS. 7 and 8.

Figure 7:
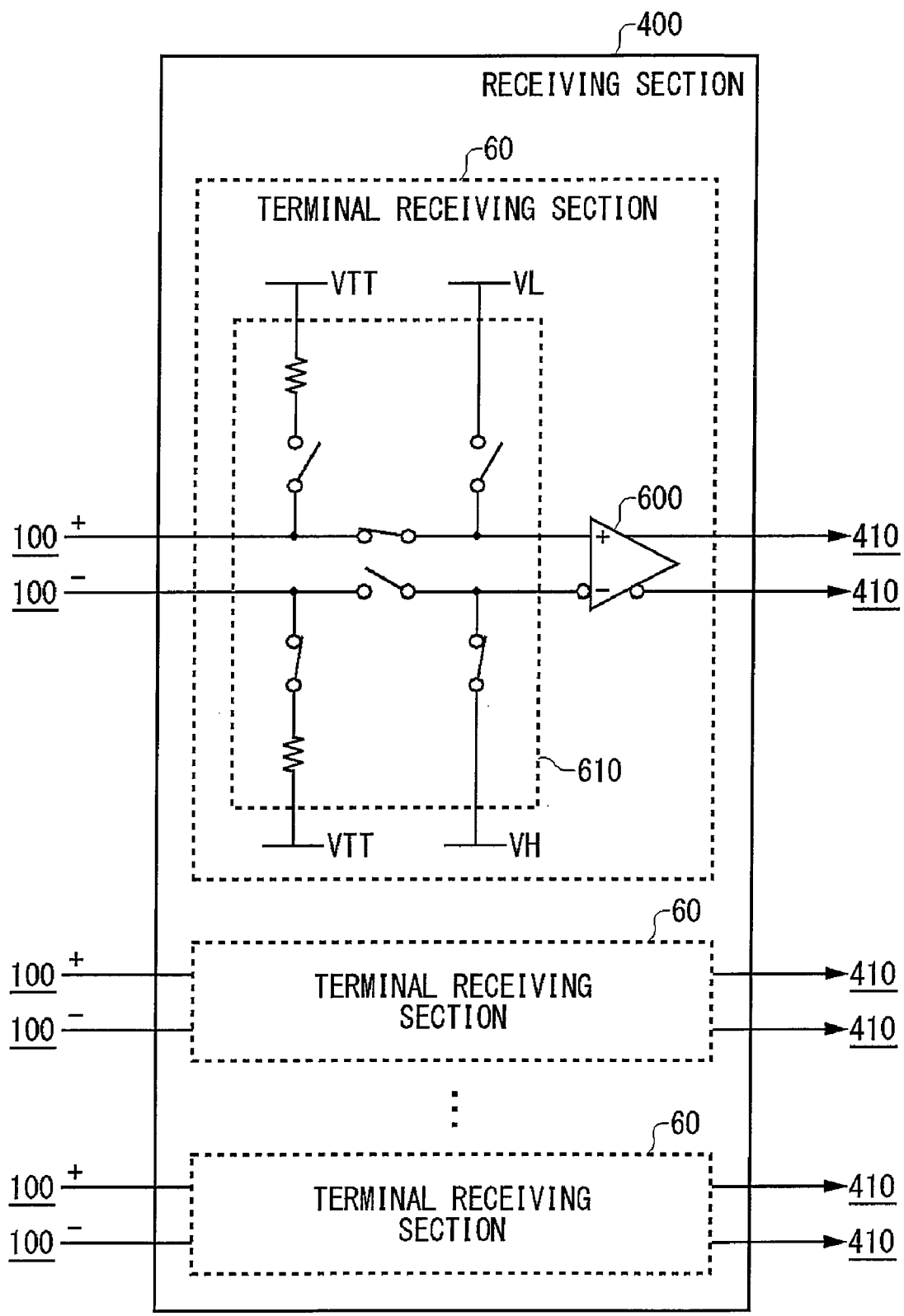
FIG. 7 schematically illustrates a test which is performed by using the receiving section 400 relating to the present embodiment for judging whether a positive signal of a differential signal is acceptable.

FIG. 7 schematically illustrates a test which is performed by using the receiving section 400 relating to the present embodiment for judging whether the positive signal of the differential signal is acceptable. To carry out this test, the single-ended switching section 610 inputs, into the negative input of the differential comparator 600, a threshold value determined for the positive signal of the differential signal, for example, a signal having a voltage level VH, in place of the negative signal of the differential signal. Here, the single-ended switching section 610 may preferably connect the negative signal of the differential signal to the middle voltage VTT of the differential signal via the terminating series resistance. In the above-described manner, the single-ended switching section 610 can independently test whether the positive signal of the differential signal favorably varies across the predetermined threshold value.

The single-ended switching section 610 can also judge whether a single-ended signal output from the corresponding device under test 100 is acceptable in the manner similar to the manner shown in FIG. 7. When performing this test, the single-ended switching section 610 inputs the output single-ended signal into one of the positive and negative inputs of the differential comparator 600 and inputs a threshold value used for determining the logic value of the single-ended signal into the other of the positive and negative inputs of the differential comparator 600. In this manner, the differential comparator 600 outputs a reception signal determined in accordance with the difference between the single-ended signal and the threshold value. Therefore, a circuit of the following stage can judge whether the voltage level of the single-ended signal exceeds the threshold value and thus has a logic value indicating true.

Figure 8:
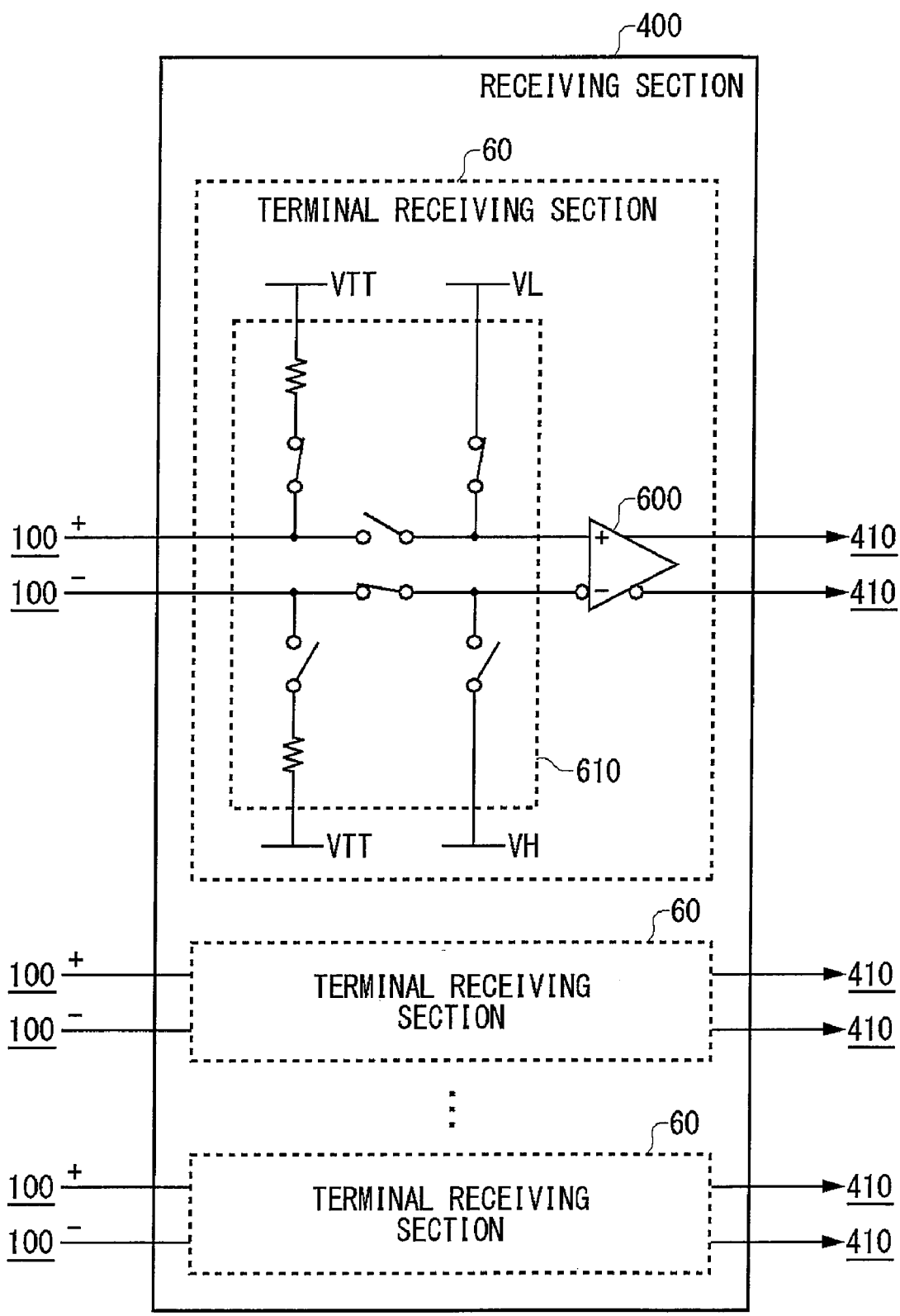
FIG. 8 schematically illustrates a test which is performed by using the receiving section 400 relating to the present embodiment for judging whether a negative signal of the differential signal is acceptable.

FIG. 8 schematically illustrates a test which is performed by using the receiving section 400 relating to the present embodiment for judging whether the negative signal of the differential signal is acceptable. To carry out this test, the single-ended switching section 610 inputs, into the positive input of the differential comparator 600, a threshold value determined for the negative signal of the differential signal, for example, a signal having a voltage level VL, in place of the positive signal of the differential signal. Here, the single-ended switching section 610 may preferably connect the positive signal of the differential signal to the middle voltage VTT of the differential signal via the terminating series resistance. In the above-described manner, the single-ended switching section 610 can independently test whether the negative signal of the differential signal correctly varies across the predetermined threshold value.

The receiving section 400 described with reference to FIGS. 6 to 8 may be alternatively provided in a different device which communicates with the devices under test 100, for example, in a semiconductor device of the same type as the devices under test 100. In this manner, the different device can appropriately accept a signal from a communicating semiconductor device whether the communicating semiconductor device outputs a differential or single-ended signal.

According to the test apparatus 10 of the present embodiment described above, the judgment as to whether the devices under test 100 are acceptable based on the output patterns are not performed concurrently with the output of the output patterns. Alternatively, the test apparatus 10 relating to the present embodiment first receives the output patterns at the additional board 230, and makes the acceptability judgment based on the output patterns much after the output patterns are output. This configuration enables the test apparatus 10 to accurately judge whether the devices under test 100 are acceptable based on the data received at the additional board 230, even when the test head 200 and the test modules 130 are not compatible with the extremely high-speed data transmission of the devices under test 100. The additional board 230 is configured to detect the header pattern in order to appropriately determine the test start timing. In addition, the additional board 230 includes the differential comparators and relating circuits which are capable of dealing with both differential signals and single-ended signals. Consequently, the additional board 230 can be flexibly applied to a variety of types of devices and tests.

Although some aspects of the present invention have been described by way of an exemplary embodiment, it should be understood that those skilled in the art might make many changes and substitutions without departing from the spirit and the scope of the present invention which is defined only by the appended claims. For example, the capture memory 420 and its peripheral circuits may be provided in the test apparatus 10, the performance board 210 or the test head 200, in place of the additional board 230. Specifically speaking, when provided in the test apparatus 10, the capture memory 420 and its peripheral circuits are provided in the circuit board included in the main frame computer realizing the test apparatus 10. Which is to say, the capture memory 420 is provided in the additional board 230, for example, to achieve the compatibility with the conventional test apparatus 10, and this configuration is only one of the exemplary embodiments.

As is apparent from the above description, an embodiment of the present invention can realize a test apparatus and a device which judge whether a device under test is acceptable by comparing data output from the device under test with an expected value.

What is claimed is:

1. A test apparatus for testing a device under test, comprising:
   a performance board on which the device under test is placed;
   an additional board configured to be added to the performance board,
   a capture memory, provided on the additional board, that stores thereon an output pattern received from the device under test in accordance with a first reference clock signal input to the additional board and;
   a header detecting section, provided on the additional board, that reads the output pattern from the capture memory in accordance with a second reference clock signal input to the additional board, detects a portion matching a predetermined header pattern in the output pattern, and outputs the output pattern, the first reference clock signal being a higher speed clock signal than the second reference clock signal; and
   a judging section provided outside the additional board that receives the output pattern that is output from the header detecting section, judges whether the output pattern is acceptable based on a result of comparison between a pattern, in the output pattern, which starts with the portion matching the predetermined header pattern and a corresponding expected value pattern.

2. The test apparatus as set forth in claim 1, further comprising a parallel converting section that converts the output pattern which is output from the device under test in a serial manner, into a parallel output pattern, wherein the capture memory stores the parallel output pattern on successive addresses, and the header detecting section detects the portion matching the predetermined header pattern, in the parallel output pattern which is sequentially read from the successive addresses of the capture memory.

3. The test apparatus as set forth in claim 1, wherein:
   the test apparatus further comprises a test head on which the performance board is mounted;
   the test head includes:
     a plurality of channel input/output sections that are connected to a plurality of terminals of a device under test, and transmit signals to the plurality of terminals and receive signals from the plurality of terminals; and
     a plurality of channel judging sections that are provided in correspondence with the plurality of channel input/output sections, each channel judging section receiving an output signal from a corresponding terminal of the device under test via a corresponding one of the plurality of channel input/output sections and comparing the received output signal with an expected value;
     a first channel input/output section included in the plurality of channel input/output sections is connected to the additional board, instead of being connected to the device under test, and receives from the additional board the pattern in the output pattern which starts with the portion matching the predetermined header pattern; and
     a first channel judging section corresponding to the first channel input/output section judges whether the output pattern is acceptable based on the result of the comparison between the pattern received by the first channel input/output section and the corresponding expected value pattern.

4. The test apparatus as set forth in claim 3, wherein a second channel input/output section included in the plurality of channel input/output sections instructs the additional board to read the output pattern from the capture memory and to output the read output pattern to the first channel input/output section.

5. The test apparatus as set forth in claim 3, wherein a third channel input/output section included in the plurality of channel input/output sections is used as an interface which is connected to the additional board so as to read and write a register in the additional board.

6. The test apparatus as set forth in claim 1, further comprising:
   a differential comparator that receives the output pattern output from the device under test, the output pattern being a differential signal; and
   a single-ended switching section that, when the test apparatus judges whether a positive signal of the differential signal is acceptable, inputs a threshold value prepared for the positive signal of the differential signal, in place of a negative signal of the differential signal, into a negative input of the differential comparator.

7. The test apparatus as set forth in claim 6, wherein when the test apparatus judges whether the negative signal of the differential signal is acceptable, the single-ended switching section inputs a threshold value prepared for the negative signal of the differential signal, in place of the positive signal of the differential signal, into a positive input of the differential comparator.

8. A device including therein a receiving section that receives a signal output from a different device, the receiving section comprising:
   a differential comparator that outputs a reception signal determined by a difference between a signal input via a positive input and a signal input via a negative input; and
   a switching section that receives the signal output from the different device and that inputs a signal in the positive input of the differential comparator and a signal in the negative input of the differential comparator, wherein the switching section comprises:

a first switch that is provided on a positive signal transmission line and that connects or disconnects the positive input of the differential comparator to the different device;

a second switch that is provided on a negative signal transmission line and that connects or disconnects the negative input of the differential comparator to the different device;

a third switch that connects or disconnects the positive input of the differential comparator and a first threshold voltage; and a fourth switch that connects or disconnects the negative input of the differential comparator and a second threshold voltage.

9. A test apparatus for testing a device under test, comprising:

a test signal supply section that supplies a test signal to the device under test;

a receiving section that receives an output signal output from the device under test in response to the test signal; and a judging section that judges whether the output signal received by the receiving section is acceptable, wherein the receiving section includes:

a differential comparator that outputs a reception signal determined by a difference between a signal input via a positive input and a signal input via a negative input; and a switching section that receives the signal output from the device under test and that inputs a signal in the positive input of the differential comparator and a signal in the negative input of the differential comparator, wherein the switching section comprises:

a first switch that is provided on a positive signal transmission line and that connects or disconnects the positive input of the differential comparator to the device under test;

a second switch that is provided on a negative signal transmission line and that connects or disconnects the negative input of the differential comparator to the device under test;

a third switch that connects or disconnects the positive input of the differential comparator and a first threshold voltage; and a fourth switch that connects or disconnects the negative input of the differential comparator and a second threshold voltage.

10. The test apparatus as set forth in claim 2, further comprising a selector that selects a predetermined output pattern from the output patterns, and supplies the selected output pattern to the parallel converting section.

11. The device as set forth in claim 8, wherein
the signal output from the different device is a differential signal,
both the positive signal and the negative signal of the differential signal are input into the differential capacitor,
the first and second switches are connected, and
the third and fourth switches are disconnected.

12. The device as set forth in claim 8, wherein
the signal output from the different device is a differential signal,
the positive signal of the differential signal is input into the differential capacitor,
the first and fourth switches are connected, and the second and third switches are disconnected.

13. The device as set forth in claim 8, wherein
the signal output from the different device is a differential signal,
the negative signal of the differential signal is input into the differential capacitor,
the second and third switches are connected, and
the first and fourth switches are disconnected.

14. The device as set forth in claim 8, wherein
the signal output from the different device is a single-ended signal,
the single-ended signal is input into the differential capacitor,
the first and fourth switches are connected, and
the second and third switches are disconnected.

15. The device as set forth in claim 8, wherein
the signal output from the different device is a single-ended signal,
the single-ended signal is input into the differential capacitor,
the second and third switches are connected, and
the first and fourth switches are disconnected.

16. The test apparatus as set forth in claim 9, wherein
the signal output from the device under test is a differential signal,
both the positive signal and the negative signal of the differential signal are input into the differential capacitor,
the first and second switches are connected, and
the third and fourth switches are disconnected.

17. The test apparatus as set forth in claim 9, wherein
the signal output from the device under test is a differential signal,
the positive signal of the differential signal is input into the differential capacitor,
the first and fourth switches are connected, and
the second and third switches are disconnected.

18. The test apparatus as set forth in claim 9, wherein
the signal output from the device under test is a differential signal,
the negative signal of the differential signal is input into the differential capacitor,
the second and third switches are connected, and
the first and fourth switches are disconnected.

19. The test apparatus as set forth in claim 9, wherein
the signal output from the device under test is a single-ended signal,
the single-ended signal is input into the differential capacitor,
the first and fourth switches are connected, and
the second and third switches are disconnected.

20. The test apparatus as set forth in claim 9, wherein
the signal output from the device under test is a single-ended signal,
the single-ended signal is input into the differential capacitor,
the second and third switches are connected, and
the first and fourth switches are disconnected.

* * * * *